United States Patent [19]
Liang

[11] Patent Number: 5,905,300
[45] Date of Patent: May 18, 1999

[54] REINFORCED LEADFRAME TO SUBSTRATE ATTACHMENT

[75] Inventor: Louis H. Liang, Los Altos, Calif.

[73] Assignee: VLSI Technology, Inc., San Jose, Calif.

[21] Appl. No.: 08/885,322

[22] Filed: Jun. 30, 1997

Related U.S. Application Data

[63] Continuation of application No. 08/222,204, Mar. 31, 1994, abandoned.

[51] Int. Cl.⁶ .................... H01L 23/495; H01L 23/498; H01L 23/48; H01L 23/06
[52] U.S. Cl. .................... 257/666; 257/671; 257/669; 257/687; 257/676
[58] Field of Search .................... 257/666, 668, 257/669, 677, 687, 671, 690, 692, 775, 676

[56] References Cited

U.S. PATENT DOCUMENTS

| | | | |
|---|---|---|---|
| 3,999,285 | 12/1976 | Lewis et al. | 29/588 |
| 4,048,438 | 9/1977 | Zimmerman | 257/669 |
| 4,139,859 | 2/1979 | Lewis et al. | 357/72 |
| 4,385,202 | 5/1983 | Spinelli et al. | 174/68.5 |
| 4,472,762 | 9/1984 | Spinelli et al. | 361/386 |
| 4,546,374 | 10/1985 | Olsen et al. | 357/71 |
| 4,546,406 | 10/1985 | Spinelli et al. | 361/386 |
| 4,631,805 | 12/1986 | Olsen et al. | 29/588 |
| 4,721,994 | 1/1988 | Mine et al. | 257/671 |
| 4,736,236 | 4/1988 | Butt | 257/677 |
| 4,967,260 | 10/1990 | Butt . | |
| 5,079,673 | 1/1992 | Kodai et al. | 361/400 |
| 5,086,334 | 2/1992 | Eberlein | 257/676 |
| 5,107,325 | 4/1992 | Nakayoshi | 257/793 |
| 5,173,766 | 12/1992 | Long et al. | 257/687 |
| 5,175,060 | 12/1992 | Enomoto et al. | 257/668 |
| 5,243,496 | 9/1993 | Mermet-Guyennett | 257/690 |
| 5,279,029 | 1/1994 | Burns | 437/209 |
| 5,281,851 | 1/1994 | Mills et al. | 257/671 |
| 5,316,204 | 5/1994 | Takehashi et al. | 257/668 |
| 5,359,222 | 10/1994 | Okutomo et al. | 257/659 |
| 5,410,182 | 4/1995 | Kurafuchi et al. | 257/775 |
| 5,528,077 | 6/1996 | Tane et al. | 257/668 |
| 5,552,631 | 9/1996 | McCormick | 257/668 |
| 5,637,919 | 6/1997 | Grabbe | 257/778 |
| 5,704,593 | 1/1998 | Honda | 257/673 |
| 5,731,631 | 3/1998 | Yama et al. | 257/778 |
| 5,751,060 | 5/1998 | Laine et al. | 257/786 |
| 5,767,570 | 6/1998 | Rostoker | 257/784 |

FOREIGN PATENT DOCUMENTS

| | | | |
|---|---|---|---|
| 0098652 | 6/1985 | Japan | 257/671 |
| 0199563 | 7/1992 | Japan | 257/666 |
| 0200321 | 3/1979 | United Kingdom | 257/671 |

*Primary Examiner*—Alexander Oscar Williams
*Attorney, Agent, or Firm*—Patrick T. King

[57] ABSTRACT

A method and apparatus for a reinforced leadframe to substrate attachment in a semiconductor assembly. In one embodiment, a printed circuit board having a plurality of electrically coupled electrical contact regions and wire bond areas formed thereon has a leadframe attached thereto such that each of the bonding fingers of the leadframe is coupled to a respective electrical contact region on the printed circuit board. A ribbon of B-staged epoxy is disposed on the leadframe such that the leadframe is disposed between the ribbon of B-staged epoxy and the printed circuit board. An integrated-circuit die is mounted on the printed circuit board with the bonding fingers of the leadframe peripherally surrounding the integrated circuit die. The bonding pads on the integrated-circuit die are electrically coupled to respective wire bond areas on the printed circuit board. By placing the ribbon of B-staged epoxy over the leadframe, the connection between each bonding finger of the leadframe and the respective electrical contact region is reinforced. Thus, the present claimed invention reduces separation between each bonding finger of the leadframe and the respective electrical contact region of the printed circuit board thereby providing improved reliability and yield in such semiconductor assemblies.

16 Claims, 5 Drawing Sheets

REINFORCED LEADFRAME TO SUBSTRATE ATTACHMENT

This application is a continuation of application No. 08/222,204 filed Mar. 31, 1994, now abandoned.

BACKGROUND OF THE INVENTION

1. Field of the Invention

This invention relates to semiconductor manufacturing techniques. Specifically, the present invention relates to reinforced attachment of a leadframe to a substrate.

2. Prior Art

Leadframes are commonly attached to substrates to form a leadframe/substrate assembly. Often, the leadframe is attached to the substrate with the smaller inner tips of the bonding fingers attached to the substrate. An integrated-circuit die is then attached to the substrate within the central opening contained within the leadframe. Bonding pads on the integrated-circuit die are electrically connected to respective bonding fingers to form a semiconductor assembly.

However, during subsequent handling of the leadframe, the bonding fingers of the leadframe may lift or detach from the substrate. If such detachment occurs the reliability of the semiconductor assembly is severely degraded. The degradation of reliability may occur as a result of compromised electrical connection between the integrated-circuit die and the detached bonding fingers, shorting due to contact between the detached bonding fingers and adjacent bonding fingers, or for numerous other reasons.

Additionally, the problem of bonding finger detachment from the substrate is compounded as ultra-fine pitch leadframes are developed. That is, with even greater numbers of bonding fingers per leadframe and with the bonding fingers become correspondingly smaller or thinner, the integrity of the attachment of the leadframe bonding fingers to the substrate is of greater concern.

In seeking to reinforce the leadframe to substrate attachment, it is desired to keep the cost of the assembly to a minimum, and insure that any reinforcement means are compatible with standard subsequent processing steps.

Thus, the need has arisen for means to reinforce leadframe to substrate attachment which does not substantially increase the cost of the assembly and which is compatible with standard subsequent processing steps.

SUMMARY OF THE INVENTION

It is therefore one object of the present invention to provide a reinforced leadframe to substrate attachment which does not substantially increase the cost of the assembly and which is compatible with standard subsequent processing steps. Therefore, the present invention provides, in one embodiment, a layer of adhesive which is placed on a leadframe after the leadframe has been attached by thermal compression to a substrate. The layer of adhesive such as, for example, epoxy, is placed over the leadframe such that the leadframe is disposed between the substrate and the layer of epoxy. After curing, the epoxy serves to reinforce the thermal compression created bond between the leadframe and the substrate. As a result, the reliability and yield of the package is enhanced. Furthermore, the epoxy does not substantially increase the cost of the leadframe/substrate attachment, and the layer of epoxy is compatible with standard subsequent processing steps.

In another embodiment of the present claimed invention, a layer of adhesive is placed on a leadframe after the leadframe has been attached by thermal compression to a printed circuit board. The printed circuit board has a plurality of electrically connected wire bond areas and electrical contact regions formed thereon. The leadframe is attached to the printed circuit board such that each of the bonding fingers is coupled to a respective electrical contact region on the printed circuit board. Next, a layer of adhesive such as, for example, a ribbon of B-staged epoxy is placed over the leadframe such that the leadframe is disposed between the printed circuit board and the ribbon of B-staged epoxy. After curing, the ribbon of B-staged epoxy serves to reinforce the thermal compression created bond between the leadframe and the printed circuit board. As a result the reliability and yield of the package is enhanced.

Thus, the present claimed invention provides a reinforced leadframe to substrate attachment which does not substantially increase the cost of the assembly and which is compatible with standard subsequent processing steps.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
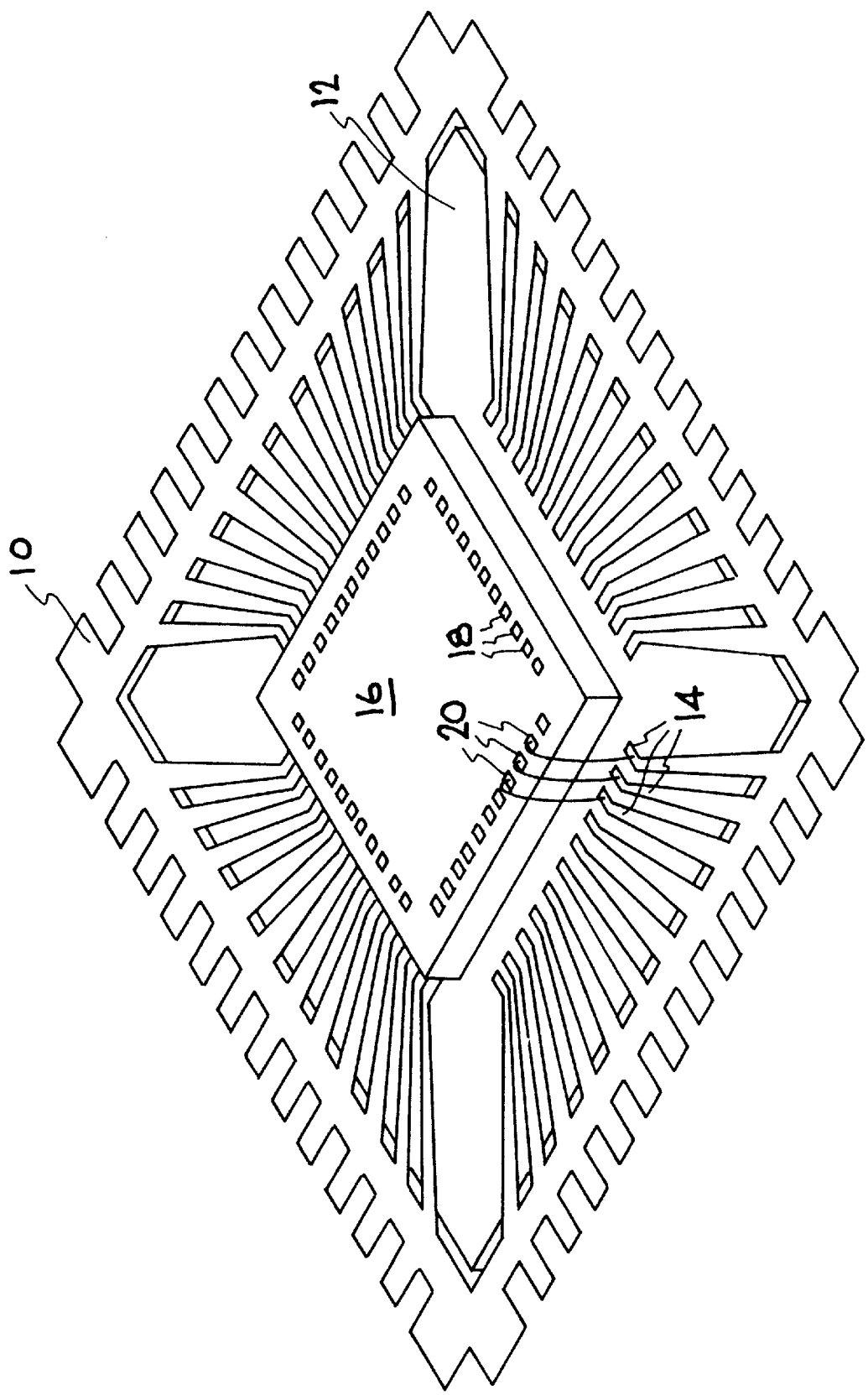
FIG. 1 is a perspective view of a portion of a Prior Art conventional leadframe mounted on a substrate.

With reference now to Prior Art FIG. 1, a perspective view of a portion of a conventional leadframe 10 mounted on a substrate is shown. Leadframe 10 is attached to substrate 12 using, for example, thermal compression with bonding fingers, typically shown as 14, extending inwardly and peripherally surrounding a centrally located opening in leadframe 10. An integrated-circuit die 16 is attached to substrate 12 within the centrally located opening of leadframe 10. Bonding pads, typically shown as 18, on integrated-circuit die 16 are electrically connected to bonding fingers 14 using, for example, bonding wires, typically shown as 20. However, during subsequent handling, or simply as the result of weak bonds between leadframe 10 and substrate 12, bonding fingers 14 may detach or lift from substrate 12.

With reference still to Prior Art FIG. 1, when such detachment occurs between bonding fingers 14 and substrate 12, the reliability of the semiconductor assembly is severely degraded. The degradation of reliability may occur as a result of intermittent electrical connection between integrated-circuit die 16 and the detached bonding fingers, shorting due to contact between the detached bonding fingers and adjacent bonding fingers, or for numerous other reasons.

Figure 2:
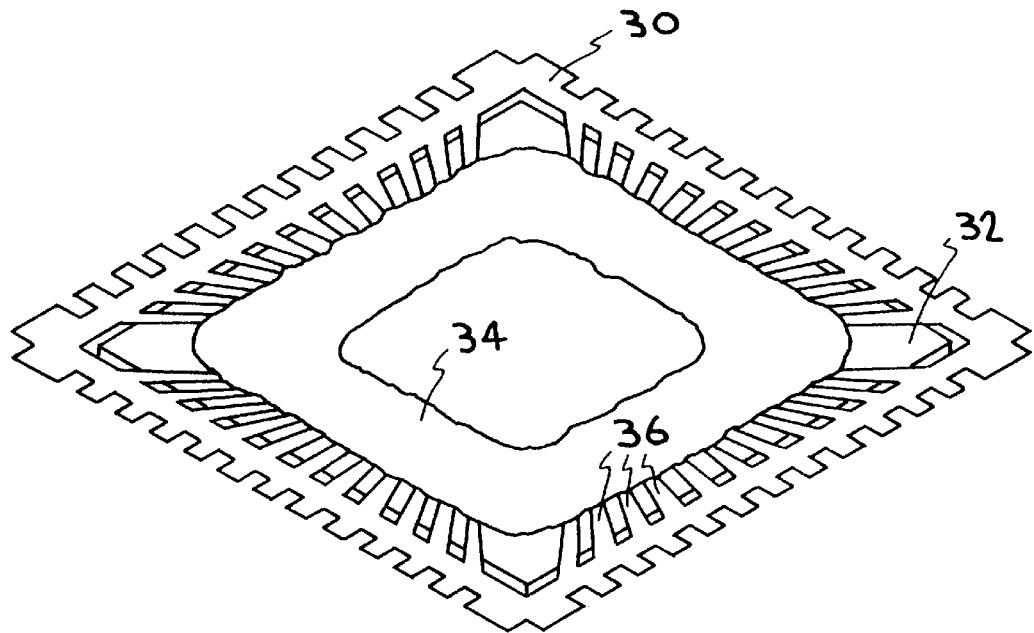
FIG. 2 is a perspective view of one embodiment of the invention in which a leadframe/substrate assembly has a layer of adhesive disposed thereover in accordance with the present invention.

Referring now to FIG. 2, perspective view of a leadframe/substrate assembly having a layer of adhesive disposed thereover is shown. A leadframe 30 is disposed on the top surface of a substrate 32. In the present embodiment, substrate 32 is a thermally-conductive, electrically-insulated substrate. Although such a substrate is used in the present embodiment, the present invention is also well suited to the use of other substrates well known in the art including but not limited to a printed circuit board. After the attachment of leadframe 30 to substrate 32, an inexpensive layer of adhesive 34 is placed over leadframe 30 and substrate 32. In the present embodiment, layer 34 is formed of epoxy, although the present claimed invention is well suited to the use of numerous other types of adhesive well known in the art, including but not limited to a ribbon of B-staged epoxy. After a curing process, epoxy layer 34 reinforces the bond between leadframe 30 and substrate 32. After curing of epoxy layer 34, an integrated-circuit die, not shown, is mounted on substrate 32 and electrical connection is made from bonding pads of the integrated-circuit die to respective bonding fingers, typically shown as 36, of leadframe 30. By placing layer 34 on leadframe 30, detachment of bonding fingers 36 from substrate 32 is prevented, thereby improving the reliability of the semiconductor assembly.

Figure 3:
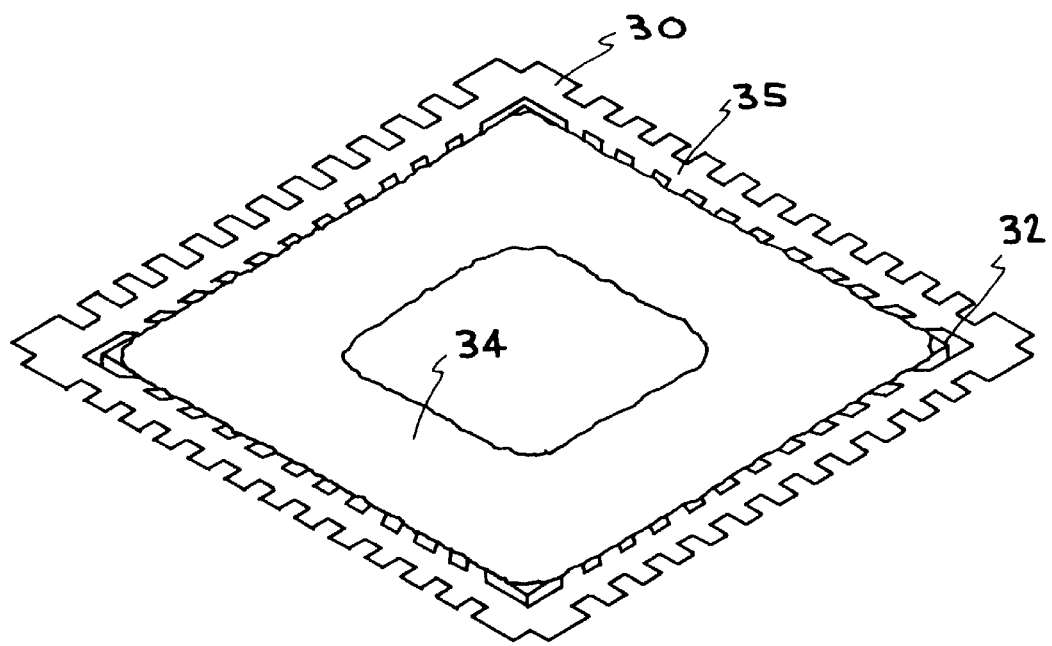
FIG. 3 is a perspective view of another embodiment of the invention in which a leadframe/substrate assembly has a layer of adhesive disposed over a large portion thereof in accordance with the present invention.

With reference now to FIG. 3 a perspective view of another embodiment of the present claimed invention is shown. Although epoxy layer 34 is disposed over leadframe 30 only above the point at which the inner ends of bonding fingers 36 are attached to substrate 32 in FIG. 2, the present claimed invention is well suited to other configurations of epoxy layer 34. As shown in the embodiment of FIG. 3, epoxy layer 34 extends from the central opening of leadframe 30 all the way out to the dambar portion 35 of leadframe 30. In such a configuration, because layer of epoxy 34 is chemically compatible with the plastic material used in subsequent processes to encapsulate the semiconductor assembly, the adhesion of mold compound to the semiconductor assembly is enhanced. Thus, the present claimed invention provides a reinforced leadframe to substrate attachment which does not substantially increase the cost of the assembly and which is compatible with standard subsequent processing steps.

Figure 4:
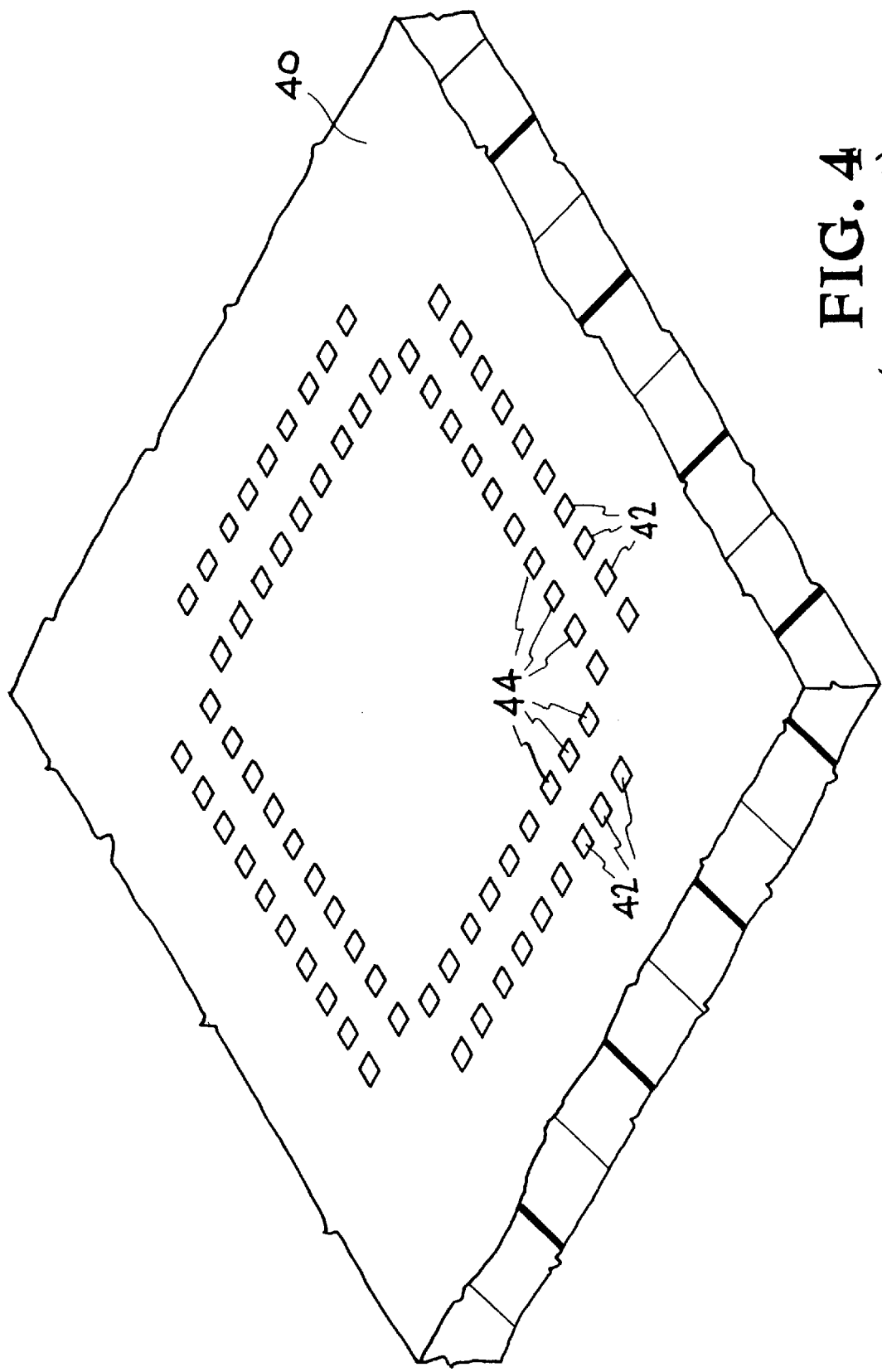
FIG. 4 is a perspective view of a portion of a Prior Art printed circuit board having electrical contact regions and wire bond areas formed thereon.

With reference next to Prior Art FIG. 4, a perspective view of a portion of a conventional printed circuit board 40 is shown. Printed circuit board 40 has electrical contact regions, typically shown as 42, and wire bond areas, typically shown as 44, formed thereon. Electrical contact regions 42 and wire bond areas 44 are electrically connected through traces in printed circuit board 40. Electrical contact regions 42 and wire bond areas 44 are formed on printed circuit board 40 to accommodate the placement of a leadframe thereon. Typically, a leadframe, not shown is attached to printed circuit board 40 with the inner tips of the bonding fingers of the leadframe attached to respective electrical contact regions 42. After an integrated-circuit die, not shown, is mounted to printed circuit board 40 within the opening centrally located within the leadframe, bonding pads on the integrated-circuit die are electrically connected to wire bond areas 44 of printed circuit board 40 using, for example, bonding wires, not shown.

Figure 5:
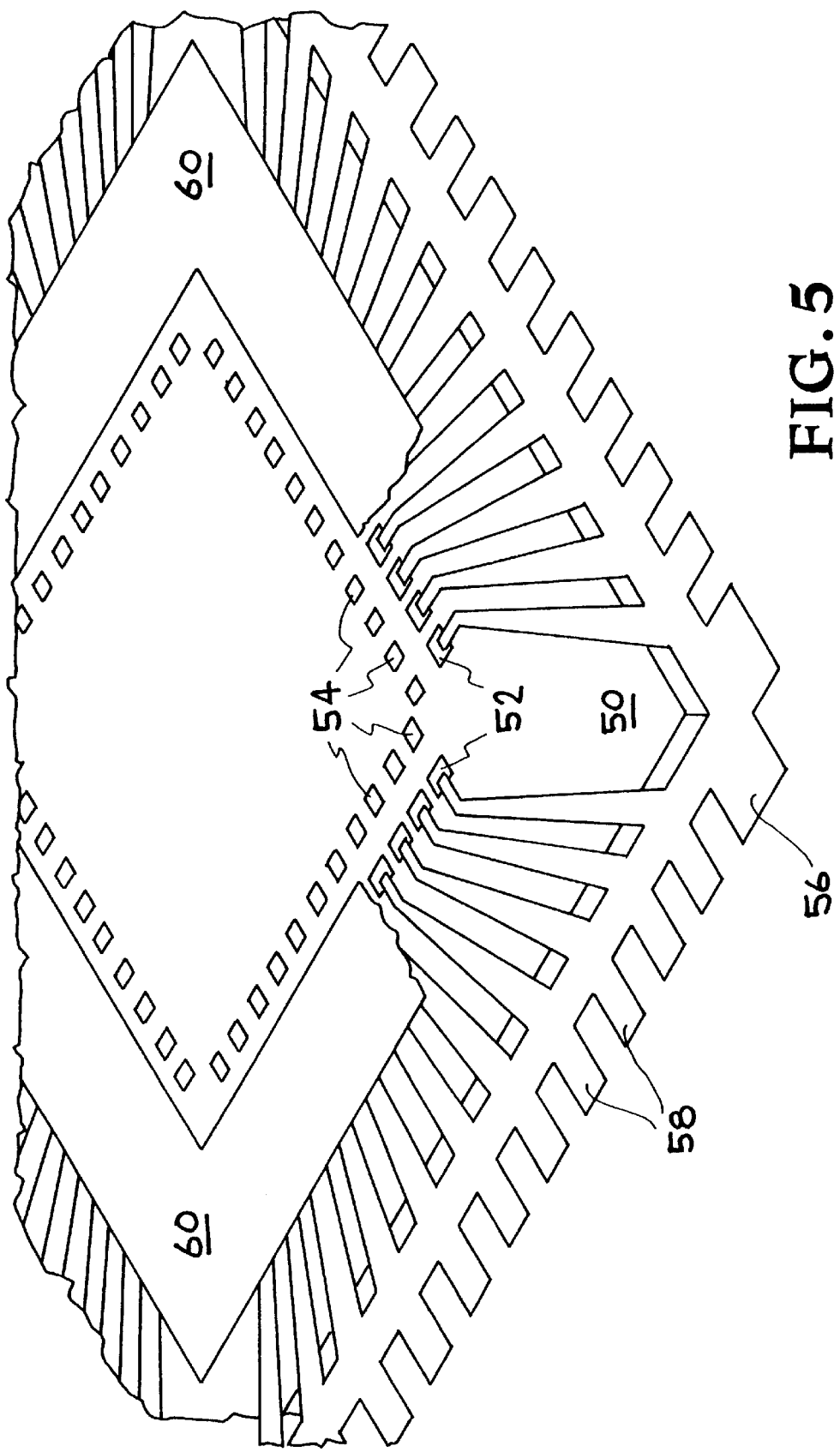
FIG. 5 is a perspective view of another embodiment of the invention in which a leadframe/printed circuit board assembly has a ribbon of B-staged epoxy disposed thereover, (the ribbon of B-staged epoxy is shown in a partial cutaway view for clarity) in accordance with the present invention.

With reference now to FIG. 5, another embodiment of the present invention is shown. As shown in FIG. 5, a leadframe 56 is attached to printed circuit board 50 using, for example, thermal compression such that the inner tips of bonding fingers, typically shown as 58 are connected to respective electrical contact regions, typically shown as 52. Although a printed circuit board is used in the present embodiment, the present invention is also well suited to numerous other types of substrates including, but not limited to, thermally-conductive, electrically insulated substrates.

With reference still to FIG. 5, an inexpensive ribbon of B-staged epoxy 60 is placed over leadframe 56 and printed circuit board 50 above the point where the inner tips of bonding fingers 58 are connected to electrical contact regions 52 of printed circuit board 50. In the present embodiment, a ribbon of B-staged epoxy 60 is used, although the present claimed invention is well suited to the use of numerous other types of adhesive well known in the art, including but not limited to potting epoxy. After curing of ribbon of B-staged epoxy 60, an integrated-circuit die, not shown, is mounted on printed circuit board 50 and electrical connection is made from bonding pads of the integrated-circuit die to respective bonding fingers, typically shown as 58, of leadframe 56. By placing ribbon of B-staged epoxy 60 on leadframe 56, detachment of bonding fingers 58 from electrical contact regions 52 of printed circuit board 50 is prevented, thereby improving the reliability of the semiconductor assembly.

Figure 6:
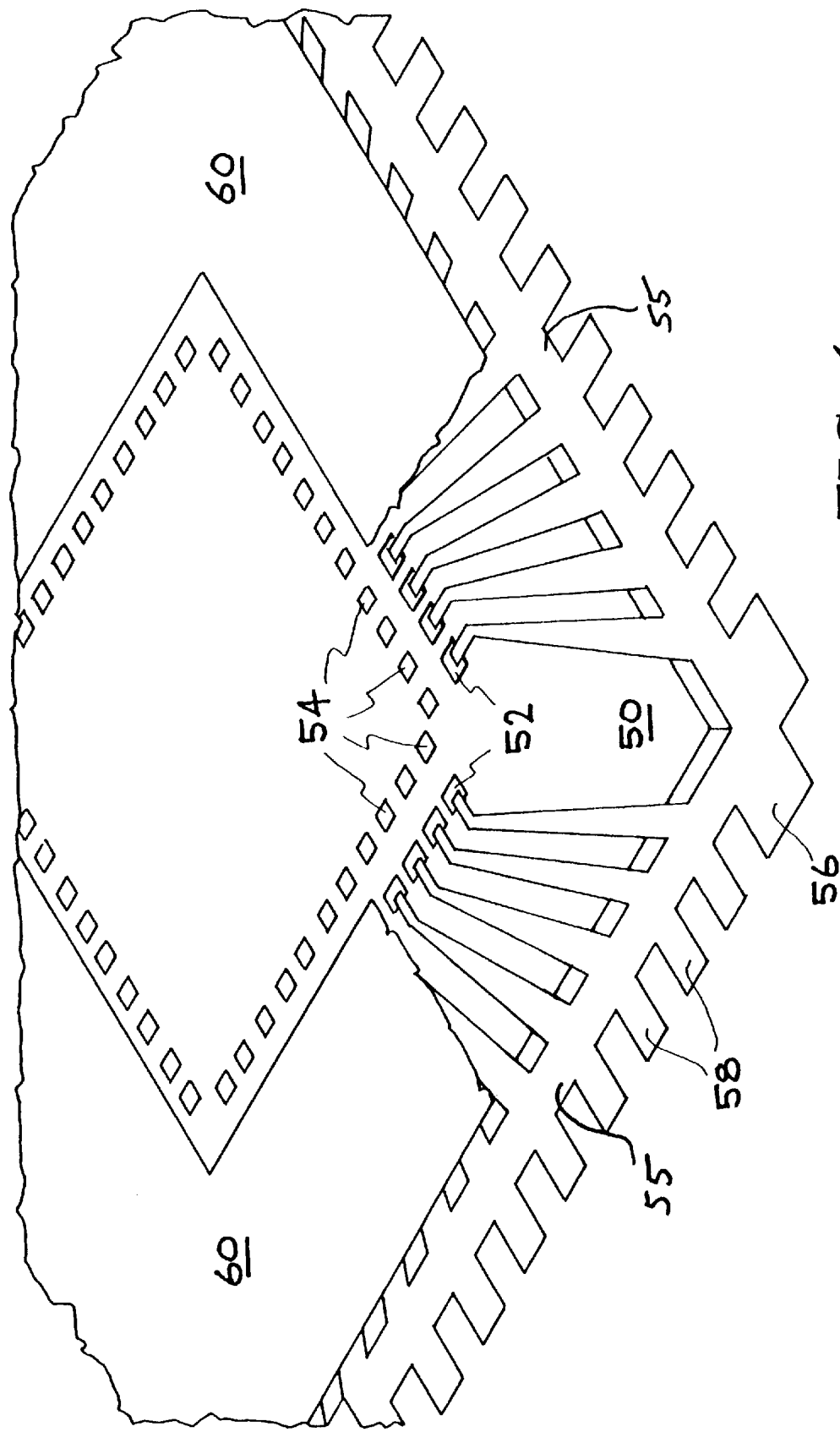
FIG. 6 is a perspective view of another embodiment of the invention in which a leadframe/printed circuit board assembly has a ribbon of B-staged epoxy disposed over a large portion thereof (the ribbon of B-staged epoxy is shown in a partial cutaway view for clarity ) in accordance with the present invention.

Referring next to FIG. 6, a perspective view of another embodiment of the present claimed invention is shown. Although ribbon of B-staged epoxy 60 is disposed over leadframe 56 only above the point at which the inner ends of bonding fingers 58 are attached to electrical contact regions 52 of printed circuit board 50 in FIG. 5, the present claimed invention is well suited to other configurations of ribbon of B-staged epoxy 60. As shown in the embodiment of FIG. 6, ribbon of B-staged epoxy 60 is placed over leadframe 56 the point at which the inner ends of bonding fingers 58 are attached to electrical contact regions 52 of printed circuit board 50 and extending out to the dambar portion 55 of printed circuit board 50. In such a configuration, because ribbon of B-staged epoxy 60 is chemically compatible with the plastic material used in subsequent processes to encapsulate the semiconductor assembly, the adhesion of mold compound to the semiconductor assembly is enhanced. Furthermore, a thermally conductive ribbon of B-staged epoxy 60 may also be used in the present claimed invention to increase heat dissipation away from the integrated-circuit die, not shown.

Thus, the present claimed invention provides a reinforced leadframe to substrate attachment which does not substantially increase the cost of the assembly and which is compatible with standard subsequent processing steps.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A semiconductor assembly comprising:
   a substrate having an upper and a lower surface,
   a leadframe having a plurality of inwardly-extending bonding fingers disposed on said upper surface of said substrate, said plurality of inwardly-extending bonding fingers disposed peripherally surrounding an opening centrally located within said leadframe, each of said plurality of inwardly-extending bonding fingers having a first end and a second end, said first end disposed proximate to said centrally located opening, said second end disposed distant from said centrally located opening such that said plurality of inwardly-extending bonding fingers extend radially away from said centrally located opening, each of said first ends of said inwardly-extending bonding fingers being bonded to said substrate,
   a layer of adhesive disposed only on said leadframe with said leadframe disposed between said substrate and said layer of adhesive such that said bond between said first ends of said inwardly-extending bonding fingers and said substrate is reinforced by said layer of adhesive, which is only on said leadframe, and
   an integrated-circuit die having bonding pads formed thereon is directly mounted on said substrate, said integrated-circuit die disposed within said centrally located opening in said leadframe such that said plurality of inwardly-extending bonding fingers peripherally surround said integrated-circuit die, each of said bonding pads on said integrated-circuit die adapted to being electrically coupled to a respective inwardly-extending bonding finger of said leadframe, said integrated-circuit die bordered by said layer of adhesive, said integrated-circuit die further disposed such that said layer of adhesive does not cover said integrated-circuit die, which is mounted directly to said substrate.

2. The semiconductor assembly of claim 1 wherein said substrate is comprised of a printed circuit board.

3. The semiconductor assembly of claim 1 wherein said substrate is comprised of a thermally conductive heat sink.

4. The semiconductor assembly of claim 1 wherein said layer of adhesive is comprised of a layer of epoxy.

5. The semiconductor assembly of claim 4 wherein said layer of epoxy is disposed on said leadframe only above where said first end of each of said inwardly-extending bonding fingers of said leadframe is coupled to said upper surface of said substrate.

6. The semiconductor assembly of claim 1 wherein said layer of adhesive is comprised of a ribbon of B-staged epoxy.

7. The semiconductor assembly of claim 6 wherein said ribbon of B-staged epoxy is disposed on said leadframe only above where said first end of each of said inwardly-extending bonding fingers of said leadframe is coupled to said upper surface of said substrate.

8. The semiconductor assembly of claim 6 wherein said ribbon of B-staged epoxy is thermally-conductive.

9. A semiconductor assembly comprising:
   a printed circuit board having an upper and a lower surface, said printed circuit board having a plurality of electrical contact regions and a plurality of corresponding separate wire bond areas formed on said upper surface thereof, wherein respective ones of said electrical contact regions are electrically coupled to respective ones of said wire bond areas,
   a leadframe having a plurality of inwardly-extending bonding fingers said plurality of inwardly-extending bonding fingers disposed peripherally surrounding an opening centrally located within said leadframe, each of said plurality of inwardly-extending bonding fingers having a first end and a second end, said first end disposed proximate to said centrally located opening, said second end disposed distant from said centrally located opening such that said plurality of inwardly-extending bonding fingers extend radially away from said centrally located opening, said leadframe disposed on said printed circuit board with each of said first ends of said inwardly-extending bonding fingers coupled to a respective electrical contact region on said printed circuit board,
   a layer of adhesive disposed on said leadframe with said leadframe disposed between said printed circuit board and said layer of adhesive such that each of said bonds between each of said first ends of said inwardly-extending bonding fingers and said respective electrical contact region on said printed circuit board is reinforced by said layer of adhesive, and
   an integrated-circuit die having bonding pads formed thereon is mounted directly on said printed circuit board, said integrated-circuit die disposed within said centrally located opening in said leadframe such that said plurality of inwardly-extending bonding fingers peripherally surround said integrated circuit die, said bonding pads on said integrated-circuit die adapted to being electrically coupled to respective wire bond areas on said upper surface of said printed circuit board, said integrated-circuit die bordered by said layer of adhesive, said integrated-circuit die further disposed such that said layer of adhesive does not cover said integrated-circuit die, which is mounted directly to said substrate.

10. The semiconductor assembly of claim 9 wherein said layer of adhesive is comprised of a layer of epoxy.

11. The semiconductor assembly of claim 10 wherein said layer of epoxy is disposed on said leadframe only above where said first ends of each of said inwardly-extending bonding fingers of said leadframe is coupled to said contact areas on said upper surface of said printed circuit board.

12. The semiconductor assembly of claim 10 wherein said layer of epoxy is disposed over said leadframe and over said upper surface of said printed circuit board except for said wire bond areas and said upper surface of said printed circuit board which remains exposed by said centrally located opening in said leadframe when said leadframe is disposed on said printed circuit board.

13. The semiconductor assembly of claim 9 wherein said layer of adhesive is comprised of a ribbon of B-staged epoxy.

14. The semiconductor assembly of claim 13 wherein said ribbon of B-staged epoxy is disposed over said leadframe and over said upper surface of said printed circuit board only above where each of said first ends of said inwardly-extending bonding fingers of said leadframe is coupled to said contact areas on said upper surface of said printed circuit board.

15. The semiconductor assembly of claim 13 wherein said ribbon of B-staged epoxy is disposed over said leadframe and said upper surface of said printed circuit board except for said wire bond areas and said upper surface of said printed circuit board which remains exposed by said centrally located opening in said leadframe when said leadframe is disposed on said printed circuit board.

16. The semiconductor assembly of claim 13 wherein said ribbon of B-staged epoxy is thermally conductive.

* * * * *